(12) United States Patent
Merchant

(10) Patent No.: US 6,700,160 B1
(45) Date of Patent: Mar. 2, 2004

(54) DOUBLE-DIFFUSED MOS (DMOS) POWER TRANSISTOR WITH A CHANNEL COMPENSATING IMPLANT

(75) Inventor: Steven L. Merchant, Milford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 296 days.

(21) Appl. No.: 09/690,263

(22) Filed: Oct. 17, 2000

(51) Int. Cl.$^7$ ................................. H01L 29/76
(52) U.S. Cl. ................ 257/338; 257/335; 257/341; 257/345
(58) Field of Search .................. 257/491–493, 257/335–336, 344, 408–416, 345, 338, 341, 349

(56) References Cited

U.S. PATENT DOCUMENTS

| | | | |
|---|---|---|---|
| 5,381,031 A | * | 1/1995 | Shibib .................. 257/488 |
| 5,627,394 A | * | 5/1997 | Chang et al. ............ 257/335 |
| 6,252,278 B1 | * | 6/2001 | Hsing .................. 257/335 |
| 6,528,850 B1 | * | 3/2003 | Hebert ................. 257/345 |
| 2002/0030225 A1 | * | 3/2002 | Nakamura et al. ........ 257/338 |

FOREIGN PATENT DOCUMENTS

JP         11087700 A    *   3/1999

* cited by examiner

Primary Examiner—Minhloan Tran
Assistant Examiner—Thomas L Dickey
(74) Attorney, Agent, or Firm—W. Daniel Swayze, Jr.; W. James Brady; Frederick J. Telecky, Jr.

(57) ABSTRACT

An improved DMOS power transistor (20) with a single p-body implant (12) and including an n-type channel compensating implant (NCCI) (24). The improved DMOS power transistor (20) provides a more favorable trade-off between threshold voltage ($V_T$) and on-state resistance, while increasing the safe operating area (SOA). The NCCI (24) also improves the off-state breakdown voltage, and allows a larger fraction of the gate bias voltage to be supported on the thin gate oxide (32). The present invention can be fabricated using self-aligned fabrication techniques so that the channel length (22) is insensitive to lithography equipment.

16 Claims, 1 Drawing Sheet

DOUBLE-DIFFUSED MOS (DMOS) POWER TRANSISTOR WITH A CHANNEL COMPENSATING IMPLANT

FIELD OF THE INVENTION

The present invention relates generally to semiconductor devices, and more particularly to a double-diffused MOS (DMOS) power transistor.

BACKGROUND OF THE INVENTION

In a conventional DMOS power transistor 10 formed with a single p-body implant 12, as shown in FIG. 1, a trade-off exists between the threshold voltage ($V_T$) and the pinched-body sheet resistance. A low threshold voltage is attractive for ease of gate drive and low source-to-drain on-state resistance, necessitating a body region 14 with a low surface concentration and/or short channel. These attributes imply high body sheet resistance which makes the parasitic NPN bipolar transistor, shown at 16 with the p-body 12 as base, susceptible to easy turn-on. Activation of the parasitic bipolar transistor results in restricting the transistor safe operating area (SOA) of the power transistor 10, and renders the power transistor unusable for simultaneous high current/high voltage application, when, for example, switching off an inductive load.

Other known ways of dealing with this trade-off are to use of a very deep p-type diffusion in addition to the p-body diffusion, and to use high energy MeV ion implantation to form a retrograde body.

SUMMARY OF THE INVENTION

The present invention achieves technical advantages as a double-diffused MOS (DMOS) power transistor having a channel compensating implant. A shallow n-type channel compensating implant (NCCI) is employed to decouple the p-body surface concentration and pinched body sheet resistance. The doping of the NCCI overcompensates the lighter doped portion of the graded p-body, making it n-type. This results in partial compensation of the heavy doped p-body near the transistor n+source, achieving a shorter, more lightly doped channel with the same heavy doped p-body beneath the n+transistor source. The power transistor of the present invention gives a more favorable trade-off between threshold voltage/on-state resistance and safe operating area. The NCCI allows a larger fraction of the transistor bias voltage to be supported on the thin gate oxide proximate the transistor gate. The present invention achieves further technical advantages as it can be fabricated using a self-aligned technique with a channel length that is insensitive to lithography techniques.

DETAILED DESCRIPTION OF THE PREFERRED EMBODIMENT

Figure 1:
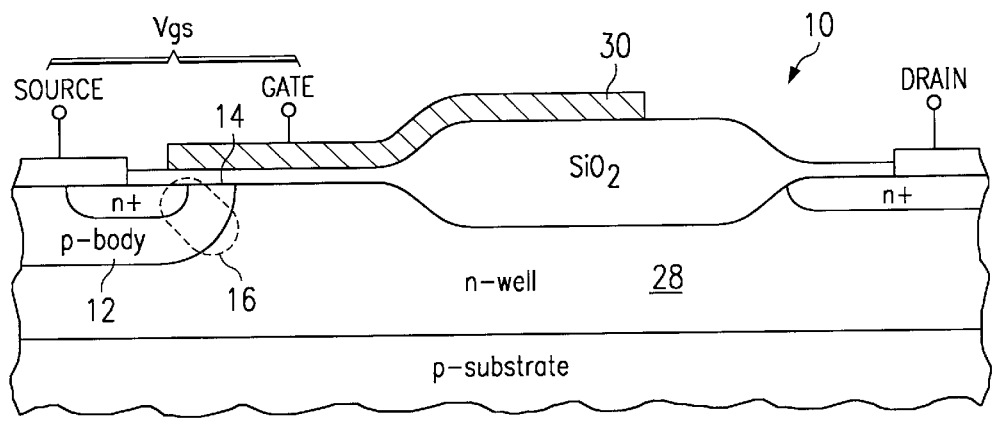
FIG. 1 is a side sectional view of a conventional DMOS power transistor formed with a single p-body implant and having a parasitic NPN bipolar transistor resulting in a restricted safe operating area (SOA)
Figure 2:
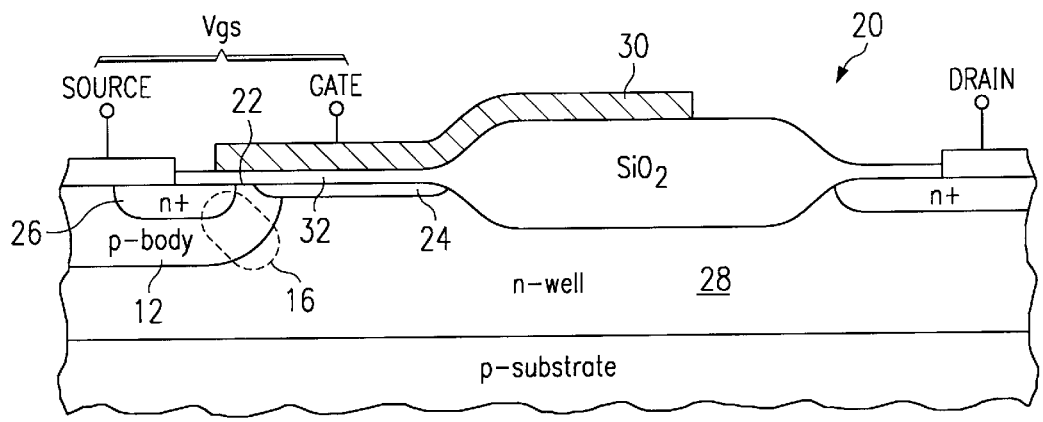
FIG. 2 is a side sectional view of an improved DMOS power transistor according to the present invention including a shallow n-type channel compensating implant (NCCI)

Referring now to FIG. 2, there is shown at 20 an improved power transistor suited for both high current/high voltage applications. In order to decouple the p-body surface concentration of the p-body well 12 and pinched body sheet resistance of channel region 22, a shallow n-type channel compensating (NCCI) implant 24 is employed, as shown in FIG. 2. The doping of the NCCI 24 is such that it overcompensates the lighter doped portion of the graded p-body, making it n-type. The heavy doped upper portion of the p-body 12 near the n+source is partially compensated. The result is a shorter, more lightly doped channel 22 while retaining the same heavy p-body doping beneath the n+transistor source. This gives the power transistor 20 a more favorable trade-off between threshold voltage $V_T$/on-state resistance and safe operating area (SOA).

In one preferred embodiment, as shown in FIG. 2, the heavy doped p-body well 12 may have a doping of $1 \times 10^{17}$ to $5 \times 10^{18}/cm^3$ and a depth of 0.7 to 2 um, a depth of 0.7 to 2 um, with the n+source well 26 having a doping of 0.1 to 0.5 um, and the n-well 28 having a doping of $8 \times 10^{15}$ to $2 \times 10^{17}/cm^3$. The NCCI 24 may preferably have a doping of $1 \times 10^{17}$ to $1 \times 10^{18}/cm^3$, a depth of 0.1 to 0.6 um, and a width of 0.5 to 5 um, with the NCCI 24 overlapping and overcompensating the upper shallow portion of the heavy doped p-body 12 as shown This example would have a pinched body resistance in the body region 12 of 1 to 5 kohm/sq. The transistor gate terminal is shown at 30 and may be formed of polysilicon. During the semiconductor fabrication process, the NCCI 24 is diffused after the FOX step, but before the deposition and etching of the polysilicon gate 30.

Figure 3:
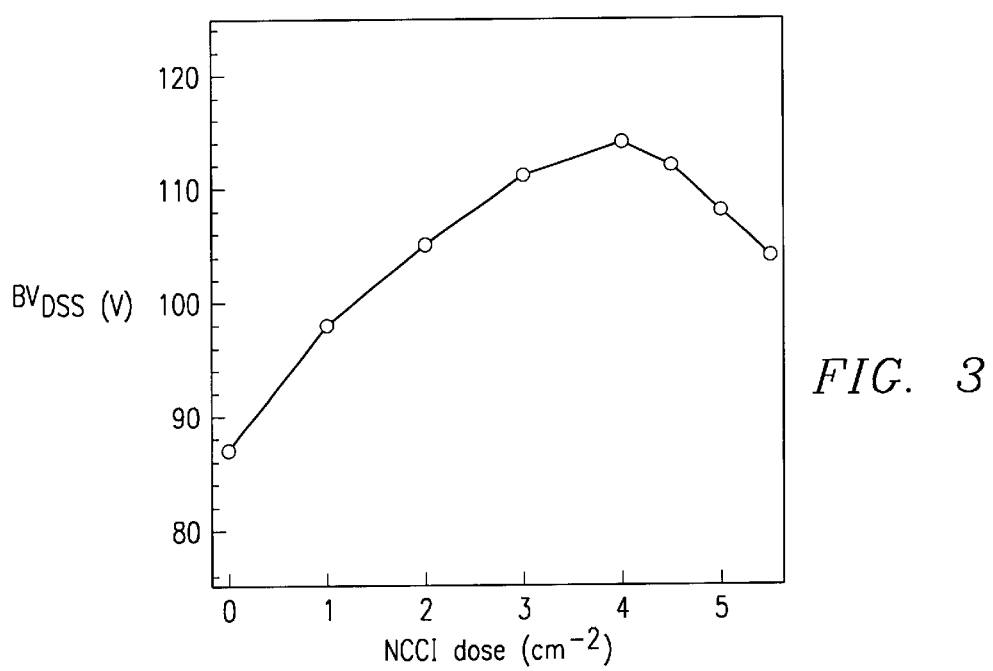
FIG. 3 is a numerical simulation showing the improved off-state breakdown voltage using the NCCI in the DMOS power transistor of FIG. 2.

Numerical simulation, displayed in FIG. 3, shows that the NCCI 24 also improves the off-state breakdown voltage $BV_{DSS}$. The NCCI implant 24 allows a larger fraction of the gate bias voltage $V_T$ to be supported on gate 30 on the thin gate oxide 32. For a high NCCI dose, the region of maximum impact ionization shifts from the silicon/oxide surface to the body/well junction, which may be an advantage for robustness.

The present invention has an advantage over the use of a conventional very deep p-type diffusion because it can be fabricated using a self-aligned technique so the channel length is insensitive to lithography. In contrast, the conventional deep p-type diffusion must be offset from the p-body to avoid raising the surface (channel) concentration, and it is difficult to accurately put the deep p-type diffusion where it is needed (under the n+source) without influencing the surface concentration. Retrograde profiles require expensive MeV ion implanters.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications. For instance an NMOS transistor is shown and described in detail, but the principle of using a channel compensating implant could be employed in a PMOS transistor if desired using a p-type implant (PCCI).

I claim:

1. A semiconductor MOS transistor, comprising:
   a substrate of a first type;
   a first well defined on said substrate, said first well being of a second type;
   a second well defined in said first well, said second well being of said first type;
   a third well defined in said second well, said third well being of said second type, a surface portion of said second well located between said first well and said third well forming a channel region of said semiconductor MOS transistor;

a second well defined in said first well, said second well being of said first type;

a third well defined in said second well, said third well being of said second type, a surface portion of said second well located between said first well and said third well forming a channel region of said semiconductor MOS transistor;

a channel compensating implant (CCI) defined in said first well and in a portion of said channel region of said second well to decouple said channel region from said second well;

a thin gate oxide formed over the channel region of said second well, said channel compensating implant being adjacent to said thin ate oxide; and a gate terminal defined over said thin gate oxide.

2. The semiconductor as specified in claim 1 wherein said substrate is p-substrate, said first well is n-type, said second well is p-type, and said third well is n-type.

3. The semiconductor as specified in claim 2 wherein said CCI is n-type and forms a n-type channel compensating implant (NCCI).

4. The semiconductor as specified in claim 3 wherein said p-type second well has a doping of at least $1 \times 10^{17}/cm^3$.

5. The semiconductor as specified in claim 4 wherein said NCCI has a doping of no more than $1 \times 10^{18}/cm^3$.

6. A semiconductor MOS transistor, comprising:

a substrate of a first type;

a first well defined on said substrate, said first well being of a second type;

a second well defined in said first well, said second well being of said first type;

a third well defined in said second well, said third well being of said second type, a surface portion of said second well located between said first well and said third well forming a channel region of said semiconductor MOS transistor;

a second well defined in said first well, said second well being of said first type;

a third well defined in said second well, said third well being of said second type, a surface portion of said second well located between said first well and said third well forming a channel region of said semiconductor MOS transistor;

a channel compensating implant (CCI) defined in said first well and in a portion of said channel region of said second well to decouple said channel region from said second well;

a thin gate oxide formed over the channel region of said second well; and a gate terminal defined over said thin gate oxide, wherein said CCI compensates upper portion of said second well.

7. The semiconductor as specified in claim 6 wherein said substrate is n-substrate, said first well is p-type, said second well is n-type, said third well is p-type, and said CCI is p-type forming an PCCI.

8. The semiconductor as specified in claim 6 wherein said substrate is p-substrate, said first well is n-type, said second well is p-type, and said third well is n-type.

9. The semiconductor as specified in claim 8 wherein said CCI is n-type and forms a n-type channel compensating implant (NCCI).

10. The semiconductor as specified in claim 9 wherein said p-type second well has a doping of at least $1 \times 10^{17}/cm^3$.

11. The semiconductor as specified in claim 10 wherein said NCCI has a doping of no more than $1 \times 10^{18}/cm^3$.

12. The semiconductor as specified in claim 11 further comprising a fourth well defined in said first well, wherein said NCCI comprises a portion of a channel between said third well and said fourth well having a pinched body sheet resistance of no more than 5 kohm/sq.

13. The semiconductor as specified in claim 12 wherein said third well forms a source terminal, and said fourth well forms a drain terminal.

14. A semiconductor MOS transistor, comprising:

a substrate of a first type;

a first well defined on said substrate, said first well being of a second type;

a second well defined in said first well, said second well being of said first type;

a third well defined in said second well, said third well being of said second type, a surface portion of said second well located between said first well and said third well forming a channel region of said semiconductor MOS transistor;

a second well defined in said first well, said second well being of said first type;

a third well defined in said second well, said third well being of said second type, a surface portion of said second well located between said first well and said third well forming a channel region of said semiconductor MOS transistor;

a channel compensating implant (CCI) defined in said first well and in a portion of said channel region of said second well to decouple said channel region from said second well;

a thin gate oxide formed over the channel region of said second well; and a gate terminal defined over said thin gate oxide, wherein said substrate is n-substrate, said first well is p-type, said second well is n-type, said third well is p-type, and said CCI is p-type forming an PCCI.

15. A semiconductor MOS transistor, comprising:

a substrate of a first type;

a first well defined on said substrate, said first well being of a second type;

a second well defined in said first well, said second well being of said first type;

a third well defined in said second well, said third well being of said second type, a surface portion of said second well located between said first well and said third well forming a channel region of said semiconductor MOS transistor;

a second well defined in said first well, said second well being of said first type;

a third well defined in said second well, said third well being of said second type, a surface portion of said second well located between said first well and said third well forming a channel region of said semiconductor MOS transistor;

a channel compensating implant (CCI) defined in said first well and in a portion of said channel region of said second well to decouple said channel region from said second well;

a thin gate oxide formed over the channel region of said second well; and a gate terminal defined over said thin ate oxide, wherein said substrate is p-substrate, said first well is n-type, said second well is p-type, and said third well is n-type, wherein said CCI is n-type and forms a n-type channel compensating implant (NCCI), further comprising a fourth well defined in said first well, wherein said NCCI comprises a portion of a channel between said third well and said fourth well having a pinched body sheet resistance of no more than 5 kohm/sq.

16. The semiconductor as specified in claim 15 wherein said third well forms a source terminal, and said fourth well forms a drain terminal.

* * * * *